United States Patent [19]

Schmoock

[11] 4,157,512

[45] Jun. 5, 1979

[54] ELECTRONIC CIRCUITRY HAVING TRANSISTOR FEEDBACKS AND LEAD NETWORKS COMPENSATION

[75] Inventor: James C. Schmoock, San Jose, Calif.

[73] Assignee: Raytheon Company, Lexington, Mass.

[21] Appl. No.: 894,290

[22] Filed: Apr. 7, 1978

[51] Int. Cl.[2] .......................... H03F 3/45; G06G 7/16

[52] U.S. Cl. .................................... 330/260; 307/230; 328/160; 328/161; 330/85; 330/151; 364/849

[58] Field of Search ................. 330/85, 151, 257, 260, 330/307, 294; 364/841, 850, 849; 328/160, 161; 307/230

[56] References Cited

U.S. PATENT DOCUMENTS

| | | | |
|---|---|---|---|
| 3,237,028 | 2/1966 | Gibbons | 307/230 |
| 3,739,293 | 6/1973 | Saari | 330/260 |
| 3,801,923 | 4/1974 | Russell et al. | 330/260X |
| 3,940,603 | 2/1976 | Smith | 364/849 |

*Primary Examiner*—James B. Mullins

*Attorney, Agent, or Firm*—Richard M. Sharkansky; Joseph D. Pannone

[57] ABSTRACT

An electronic circuit including an amplifier having an input adapted for coupling to an analog signal source; a current source coupled to the output of the amplifier; a feedback transistor having a collector electrode and emitter electrode connected in series between the output of the current source and the input of the amplifier; and a lead network, including a capacitor connected between the input and output of the amplifier, for stabilizing the electronic circuit. With such arrangement the current in the collector electrode of the feedback transistor rapidly becomes related to current fed to the input of the amplifier by the analog signal source.

7 Claims, 5 Drawing Figures

FIG. 4
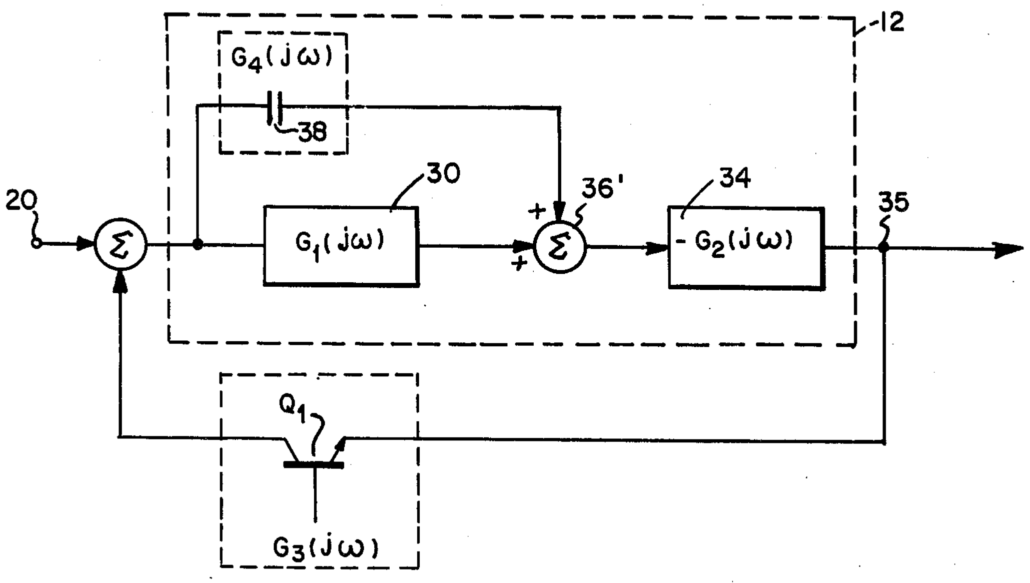
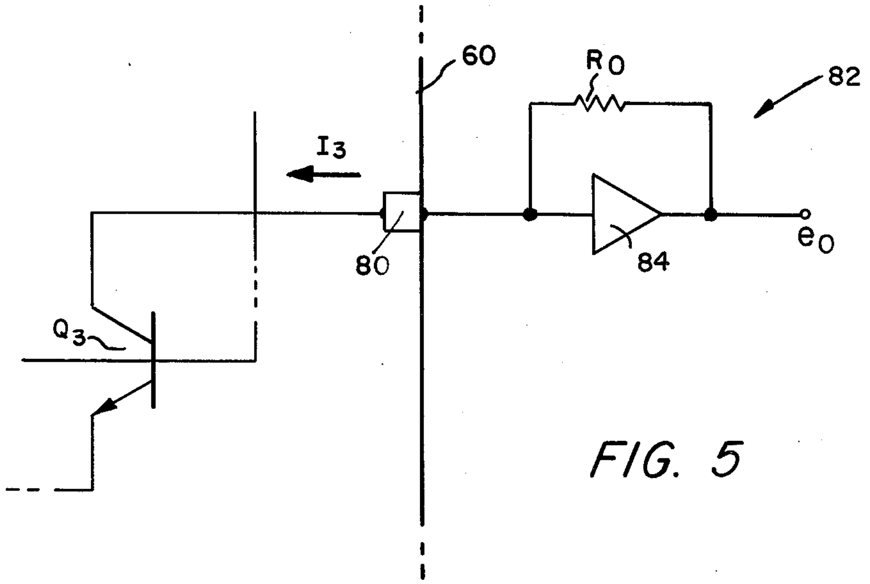
FIG. 5

ELECTRONIC CIRCUITRY HAVING TRANSISTOR FEEDBACKS AND LEAD NETWORKS COMPENSATION

BACKGROUND OF THE INVENTION

This invention relates generally to electronic circuitry and, more particularly, to electronic circuitry adapted to multiply/divide analog signals.

As is known in the art, electronic circuitry adapted to multiply/divide analog signals has a wide variety of applications. One such circuit, a so-called "log-analog multiplier," includes four transistors having serially coupled base-emitter junctions. The output current produced in a fourth, or output, one of the four transistors is proportional, to an approximation, to the product of the collector currents in a pair of such transistors divided by the collector current of the third transistor. The pair of transistors and the third transistor are coupled in the feedback path of a corresponding one of three operational amplifiers. Generally, the output of any one of such operational amplifiers is connected to the emitter electrode of the corresponding transistor through a resistor, and the input to such operational amplifier is connected to the collector electrode of such transistor. If the operational amplifier is assumed to have zero offset current and voltage, then the input current to the operational amplifier will pass to the emitter electrode of such transistor (assuming such transistor has a high beta (ratio of collector current to base current)). That is, the collector current will be approximately equal to the input current, and the output voltage of the operational amplifier will be proportional, to an approximation, to the natural log of the collector current and, hence, to the natural log of the input current. Because of the reactive characteristic of the transistor, it is generally necessary to provide a capacitor between the collector electrode of the transistor and the output of the operational amplifier for stabilization. The use of such capacitor in the feedback path for stabilization reduces the bandwidth, and hence time response, of the circuit.

SUMMARY OF THE INVENTION

With this background of the invention in mind, it is therefore an object of this invention to provide an improved electronic circuit adapted for use in multiplying-/dividing analog signals.

It is another object of this invention to provide an electronic analog multiplier/divider having improved high speed, wide bandwidth circuitry for producing collector currents, in serially connected transistors used in such multipliers, which are proportional to analog input signals being multiplied/divided.

These and other objects of the invention are attained generally by providing a feedback circuit comprising: a differential amplifier having one input adapted for coupling to an analog signal source; a current source coupled to the output of the differential amplifier; a capacitor connected between the input and output of the differential amplifier; and a feedback transistor having its collector electrode and its emitter electrode connected in series between the output of the current source and the input of the differential amplifier.

In a preferred embodiment of the invention, the differential amplifier includes: a pair of transistors having emitter electrodes coupled to a common reference electrical potential, one of such transistors having a base electrode coupled to the input of the differential amplifier, and the other one of such transistors having a base electrode adapted for coupling to a predetermined electrical potential; and a current mirror circuit coupled to the collector electrodes of such pair of transistors for producing a voltage at the differential amplifier output which is related to the difference in potential at the base electrodes of the pair of transistors. The current source includes an output transistor having a base electrode coupled to the output of the differential amplifier and a collector connected directly to an electrode of the feedback transistor. The amount of current flow through the collector electrode of the feedback transistor is related to the voltage produced at the output of the current mirror and hence by the voltage at the input to the differential amplifier. The capacitor provides lead compensation to stabilize the feedback circuit while enabling the feedback circuitry to have a rapid response time characteristic.

With such arrangement, current is rapidly produced in the collector of the feedback transistor which is substantially proportional to the input signal fed to the differential amplifier. In an analog multiplier/divider wherein four transistors have serially connected base-emitter junctions, the output current produced in the fourth, or output, one of the four transistors being, to an approximation, proportional to the collector currents in a pair of the transistors divided by the collector current of the third transistor, the pair of transistors and the third transistor are feedback transistors of a corresponding one of three of the differential amplifiers. By connecting the capacitor between the input and output of the differential amplifier and having such differential amplifier drive a current source which directly feeds the feedback transistor, the speed of the analog multiplier/divider is improved.

BRIEF DESCRIPTION OF THE DRAWINGS

The above-mentioned and other features of the invention will become more apparent by reference to the following description taken together in conjunction with the accompanying drawings, in which:

FIG. 4 is a block diagram of the differential amplifier section shown in FIG. 2; and FIG. 5 is a schematic diagram of an output circuit for the multiplier/divider circuit in FIG. 3.

DESCRIPTION OF THE PREFERRED EMBODIMENT

Figure 1:
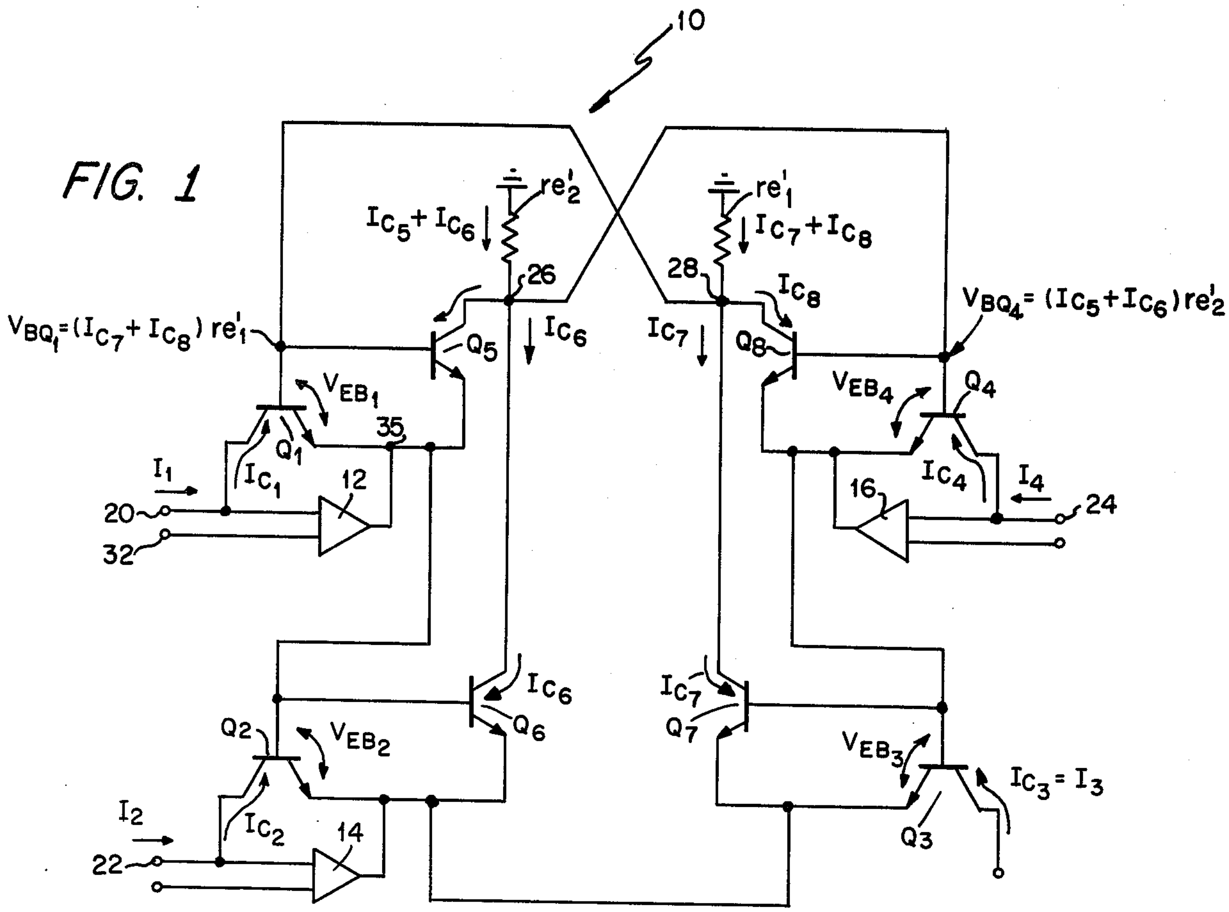
FIG. 1 is a schematic diagram of a multiplier/divider circuit using differential amplifiers according to the invention.

Referring now to FIG. 1, an electronic circuit 10 adapted to produce an output current $I_{C3}$ in the collector electrode of transistor $Q_3$ proportional to the product of the current $I_{C1}$ in the collector electrode of transistor $Q_1$ and the current $I_{C2}$ in the collector electrode of transistor $Q_2$ divided by the current $I_{C4}$ in the collector electrode of transistor $Q_4$ is shown. Such circuit 10 includes a first plurality of transistors $Q_1$, $Q_2$, $Q_3$, $Q_4$ having serially coupled base-emitter junctions. That is, the emitter electrode of transistor $Q_1$ is connected to the base electrode of transistor $Q_2$; the emitter electrodes of transistors $Q_2$, $Q_3$ are connected together and the base electrode of transistor $Q_3$ is connected to the emitter electrode of transistor $Q_4$, as shown. A second plurality of transistors $Q_5$, $Q_6$, $Q_7$, $Q_8$ is provided, the base electrode and emitter electrode of each one thereof being connected to the base electrode and emitter electrode, respectively, of a corresponding one of the first plurality of transistors $Q_1$, $Q_2$, $Q_3$, $Q_4$, as shown. In particular, the base electrode of transistor $Q_5$ is connected to the base electrode of transistor $Q_1$ and the emitter electrode of transistor $Q_5$ is connected to the emitter electrode of transistor $Q_1$. Likewise, the base electrode of transistor $Q_6$ is connected to the base electrode of transistor $Q_2$ and the emitter electrode of transistor $Q_6$ is connected to the emitter electrode of transistor $Q_2$. The base electrode of transistors $Q_8$ and $Q_4$ are connected together and the emitter electrodes of such transistors are connected together. Finally, the base electrodes of transistors $Q_3$ and $Q_7$ are connected together and the emitter electrodes of such transistors are connected together. It is here noted that the transistors $Q_1$–$Q_4$ and $Q_5$–$Q_8$ are formed on a common semiconductor substrate using conventional integrated circuit fabrication techniques. Transistors $Q_1$, $Q_5$; $Q_2$, $Q_6$; $Q_4$, $Q_8$ are matched pairs, having relatively large betas (i.e. the ratio of collector current to base current), here greater than two hundred. It follows then that the collector currents in each pair of transistors will be equal to each other. Hence: the collector current $I_{C5}$ in transistor $Q_5$ will be substantially equal to the collector current $I_{C1}$ in transistor $Q_1$, i.e. $I_{C5}=I_{C1}$; the collector current $I_{C6}$ in transistor $Q_6$ will be substantially equal to the collector current $I_{C2}$ in transistor $Q_2$ (i.e. $I_{C6}=I_{C2}$); the collector current $I_{C4}$ in transistor $Q_4$ will be substantially equal to the collector current $I_{C8}$ in transistor $Q_8$; and the collector current $I_{C7}$ in transistor $Q_7$ will be substantially equal to the collector current $I_{C3}$ in transistor $Q_3$.

The emitter-base-collector junctions of transistors $Q_1$, $Q_2$, $Q_4$ are connected in the feedback path of differential amplifier sections 12, 14, 16, respectively, as shown. The details of such differential amplifier sections 12, 14, 16 will be discussed in connection with FIGS. 2 and 3. Suffice it to say here, however, that such differential amplifier sections are identical in construction, have high gain and provide a very high input impedance to the signals fed thereto. Therefore, the current $I_1$ fed to terminal 20 of amplifier 12 is substantially the collector current $I_{C1}$ in transistor $Q_1$ (i.e. $I_1 \simeq I_{C1}$). Likewise, the currents fed to terminals 22, 24 of amplifiers 14, 16, respectively, are, substantially, the collector currents of transistors $Q_2$, $Q_4$, respectively, (i.e. $I_2 \simeq I_{C2}$, $I_4 \simeq I_{C4}$, respectively).

As is known, the base-emitter junction voltage $V_{BE}$ of a bipolar transistor may be expressed as:

$$V_{BE}=KT/q \ln I_C/I_S+(I_c)(r_e) \quad (1)$$

where:

K is Boltzman's constant q is the electron charge

T is temperature $r_e$ is the ohmic emitter resistance of the transistor $I_C$ is the collector current (i.e., here substantially the emitter current because of the high beta of the transistor)

$I_S$ is the reverse saturation current of the transistor.

Referring to FIG. 1, it follows that the following expression may be written:

$$V_{BQ1}+V_{EB1}+V_{EB2}=V_{BQ4}+V_{EB4}+V_{EB3} \quad (2)$$

where:

$V_{BQ1}$ is the voltage at the base electrode of transistor $Q_1$;

$V_{EB1}$ is the voltage produced across the base-emitter junction of transistor $Q_1$;

$V_{EB2}$ is the voltage produced across the base-emitter junction of transistor $Q_2$;

$V_{BQ4}$ is the voltage at the base electrode of transistor $Q_4$;

$V_{EB4}$ is the voltage produced across the base-emitter junction of transistor $Q_4$; and $V_{EB3}$ is the voltage produced across the base-emitter junction of transistor $Q_3$.

Combining Eqs. (1) and (2) (and considering that transistors $Q_1$–$Q_4$ are at the same temperature since they are formed on the same semiconductor substrate):

$$KT/q\,[\ln I_{C1}/I_{S1} + \ln I_{C2}/I_{S2} - \ln I_{C3}/I_{S3} - \ln I_{C4}/I_{S4}] + I_{C1}r_{e1} + I_{C2}r_{e2} - I_{C3}r_{e3} - I_{C4}r_{e4} = V_{BQ4} - V_{BQ1}; \quad (3)$$

where:

$I_{S1}$, $I_{S2}$, $I_{S3}$, $I_{S4}$ are the reverse saturation currents of transistors $Q_1$–$Q_4$, respectively, and;

$r_{e1}$–$r_{e4}$ are the ohmic emitter resistances of transistors $Q_1$–$Q_4$, respectively.

Assuming that $I_{S3}\ I_{S4}/I_{S1}\ I_{S2}$ is a constant, $\gamma$, and $r_{e1}=r_{e2}=r_{e3}=r_{e4}=r_e$ since all transistors are essentially matched since they are formed on the same semiconductor substrate, then, from the above, Equation (3) may be expressed as $$KT/\gamma q\,[\ln I_1I_2/I_3I_4]+(I_1+I_2-I_3-I_4)r_e=V_{BQ4}-V_{BQ1} \quad (4)$$

From Eq. (4) in order for:

$$\ln[I_1I_2/I_3I_4]=0 \quad (5)$$

in which case $I_3=I_1I_2/I_4$, independent of temperature, the following must hold true:

$$(I_1+I_2)-(I_3+I_4)\,r_e=V_{BQ4}-V_{BQ1} \quad (6)$$

One way to satisfy Eq. (6) is if:

$$V_{BQ4}=(I_1+I_2)r_e \quad (7)\ (a)$$

and $$V_{BQ1}=(I_3+I_4)r_e \quad (8)\ (b)$$

The collector electrodes of transistors $Q_5$, $Q_6$ are connected together at a first junction 26 and the collector electrodes of transistors $Q_7$, $Q_8$ are connected together at junction 28, as shown. A resistor $re_2'$ is connected between ground and the collector electrode of transistors $Q_5$, $Q_6$ at junction 26, as shown, and resistor $re_1'$ is connected between ground and the collector electrodes of transistors $Q_7$ and $Q_8$ at junction 28, as shown. Since the current flow through resistor $re_2'$ is $(I_{C5}+I_{C6})$, (i.e. the current in the base electrode of transistors $Q_4$, $Q_8$ being negligible) and the current flow in resistor $re_1'$ is $(I_{C7}+I_{C8})$ (i.e. the current in the base of the electrode of transistor $Q_1$, $Q_5$ being negligible), then:

$$V_{BQ4}=(I_{C5}+I_{C6})\,re_2' \text{ and} \quad (9)$$

$$V_{BQ1}=(I_{C7}+I_{C8})\ re_1' \quad (10)$$

As mentioned above, because matched transistors $Q_1$, $Q_5$; $Q_2$, $Q_6$; $Q_4$, $Q_8$; and $Q_7$, $Q_3$ have base electrodes connected together and emitter electrodes connected together, $I_1=I_{C5}$; $I_2=I_{C6}$; $I_4=I_{C8}$; and $I_3=I_{C7}$. Therefore, from Eqs. (9), (10), $$V_{BQ4}=(I_1+I_2)\ re_2' \quad (11)$$

$$V_{BQ1}=(I_3+I_4)\ re_1' \quad (12)$$

Consequently, from Eqs. (5), (6), (7), (8), and Eqs. (11) and (12), if $r_e=re_1'=re_2'$, then $\ln[I_1I_2/I_3I_4]=0$ and $I_3=I_1I_2/I_4$.

Here resistors $re_1'$ and $re_2'$ are equal to the ohmic emitter resistance, $r_e$, of the transistors $Q_1$-$Q_4$; and, therefore, the current $I_3$ in the collector electrode of transistor $Q_3$ is equal to the product of the currents $I_1$, $I_2$ divided by the current $I_3$. Further, the transistors $Q_5$, $Q_6$, $Q_7$, $Q_8$ produce current in the collector electrodes related to the current flow through the basic emitter resistances of transistors $Q_1$, $Q_2$, $Q_3$, $Q_4$. respectively. The collector electrodes are fed through resistors $re_1'$, $re_2'$ to produce compensation voltages $V_{BQ1}$, $V_{BQ4}$ in series with the serially coupled base-emitter junctions of transistors $Q_1$-$Q_4$ to compensate for the ohmic emitter resistance voltage drops produced in such transistors. The compensation voltage $V_{BQ1}$ produced in series with the base-emitter junctions of transistors $Q_1$, $Q_2$ is produced by monitoring the current flow $(I_3+I_4)$ in the collectors of transistors $Q_3$, $Q_4$ with transistors $Q_7$, $Q_8$, passing such monitoring current through resistor $re_1'$, and feeding the compensation voltage $(I_3+I_4)\ re_1'$ with proper polarity to the base electrode of transistor $Q_1$. Likewise, the compensation voltage $V_{BQ4}$ is produced by monitoring the current flow $(I_1+I_2)$ in the collectors of transistors $Q_1$, $Q_2$ with transistors $Q_5$, $Q_6$, passing such monitoring current through resistor $re_2'$, and feeding the compensation voltage $(I_1+I_2)\ re_2'$ with proper polarity to the base electrode of transistor $Q_4$.

Figure 2:
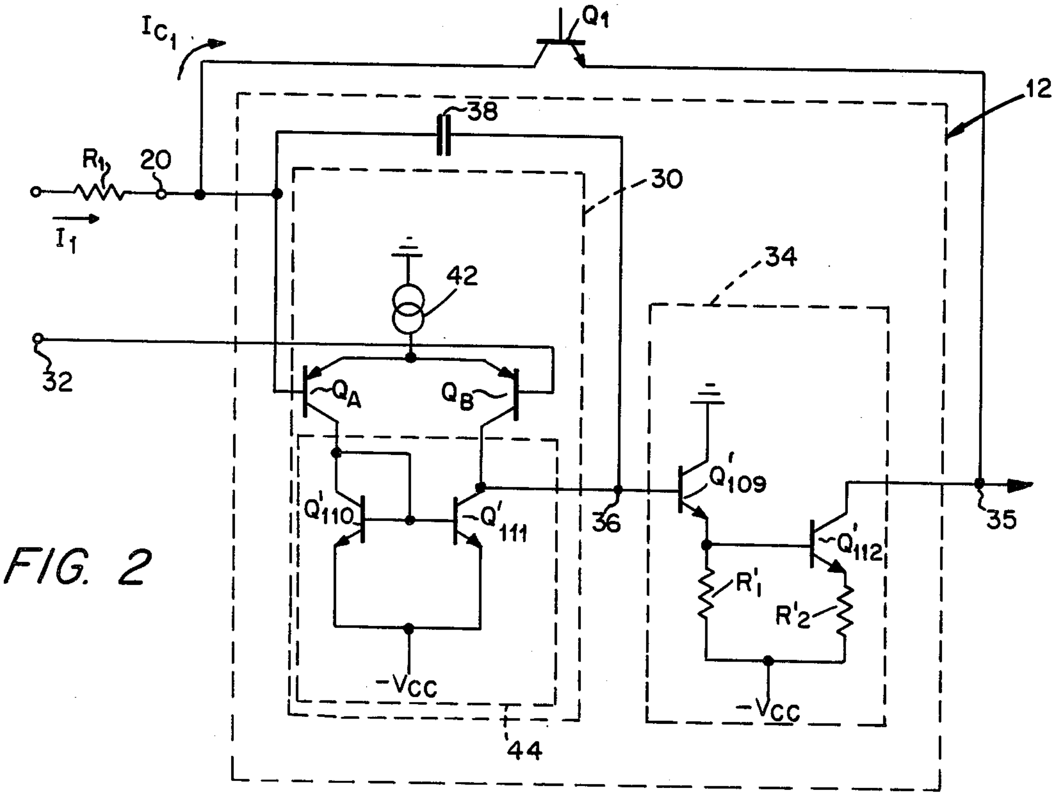
FIG. 2 is a schematic diagram of a differential amplifier section used in the multiplier/divider circuit shown in FIG. 1.

Referring now to FIG. 2, an exemplary one of the differential amplifier sections 12, 14, 16, differential amplifier section 12, is shown to include a differential amplifier 30 having a pair of input terminals 20, 32; a current source 34 coupled to the output 36 of the differential amplifier 30; and a capacitor 38 connected between the input terminal 20 and output 36, as shown. It is noted that transistor $Q_1$ is connected in the feedback path of the differential amplifier section 12; that is, the collector electrode of transistor $Q_1$ is connected directly to the input terminal 20, and the emitter electrode is connected to the output 36 of such differential amplifier section 12, as shown.

Differential amplifier 30 includes a pair of transistors $Q_A$, $Q_B$. The base electrodes of such transistors $Q_A$, $Q_B$ are connected to input terminals 20, 32, respectively, as shown. The emitter electrodes of such transistors $Q_A$, $Q_B$ are coupled to a common reference potential, here ground potential, through a current source 42, as shown. The collector electrodes of transistors $Q_A$, $Q_B$ are coupled to a current mirror circuit 44, as shown. Current mirror circuit 44 converts the differential current flowing in the collector electrodes of transistors $Q_A$, $Q_B$ to a voltage at the output 36, such voltage being related to the differential voltage produced between input terminals 32, 20. The current mirror circuit 44 includes a pair of transistors $Q_{110}'$, $Q_{111}'$ having base electrodes connected together and to the collector electrode of transistor $Q_{110}'$. The collector electrode of transistor $Q_{110}'$ is connected to the collector electrode of transistor $Q_A$ and the collector electrode of transistor $Q_{111}'$ is connected to the collector electrode of transistor $Q_B$ and provides the output 36. The emitter electrodes of transistors $Q_{110}'$, $Q_{111}'$ are connected together and to a $-Vcc$ supply. Transistor $Q_{110}'$ is therefore connected to form a diode.

The current source 34 includes a pair of transistors $Q_{109}'$, $Q_{112}'$. Transistor $Q_{109}'$ is arranged as an emitter-follower and buffers transistor $Q_{112}'$ from output 36. The base electrode of transistor $Q_{109}'$ is connected to output 36, its collector electrode is connected to ground, and its emitter electrode is connected to the $-V_{cc}$ supply through a resistor $R_1'$ (here 20 ohms), as shown. Transistor $Q_{112}'$ has its base electrode connected to the emitter electrode of transistor $Q_{109}'$, its emitter electrode connected to the $-V_{cc}$ supply through a resistor $R_2'$ (here 511 ohms), and its collector electrode connected directly to output terminal 35 (and hence connected directly to the emitter electrode of transistor $Q_1$).

In operation, the current flows through the collector electrode of transistor $Q_{112}'$, the amount of such current flow being proportional to the difference in potential between the analog signals coupled to input terminals 32, 20. Since input terminal 32 is adapted for coupling to a predetermined reference potential, here near ground potential, the voltage at output 36 is related to the voltage at input terminal 20. The voltage at output 36, i.e. at the base electrode of transistor $Q_{109}'$, determines the amount of current flow through the collector electrode of transistor $Q_{112}'$. Hence, the amount of current flow through transistor $Q_{112}'$ is proportional to the voltage of the input signal coupled to input terminal 20. In particular, the circuit shown in FIG. 2 may be represented by the block diagram shown in FIG. 4 in order to analyze the dynamic characteristics of the differential amplifier section 12 with transistor $Q_1$ connected in a feedback arrangement with such section 12. The differential amplifier 30 is represented by a block 30 having a transfer function $G_1(j\omega)$ and the capacitor 38 is represented by a transfer function $G_4(j\omega)=j\omega C$, where C is the capacitance of capacitor 38. The input to capacitor 38 and differential amplifier 30 are the same and the outputs are added at terminal 36', here represented by an adder 36'. The current source 34 is fed by the signals produced at the output of adder 36' and such source 34 may be represented by a transfer function, $-G_2(j\omega)$. The transfer function of transistor $Q_1$ may be represented as $G_3(j\omega)$. Absent the capacitor 38 the open loop gain of the system shown in FIG. 4 is:

$$A(j\omega)=-G_1(j\omega)\cdot G_2(j\omega)\cdot G_3(j\omega). \quad (13)$$

Further, such system, absent capacitor 38, is unstable. In particular, there is, absent capacitor 38, excessive phase lag provided by, inter alia, the differential amplifier 30 to high frequency components. The system is made stable by capacitor 38. In particular, because the transfer function of capacitor 38 is $G_4(j\omega)=j\omega C$ the value of capacitance, C, is selected to add phase lead to the high frequency components and thereby cancel or compensate for the phase lag provided to these high frequency components by differential amplifier 30. That is, the capacitor 38 provides a lead network for stabilizing the closed loop response of the differential amplifier section 12 with the transistor $Q_1$ coupled in feedback relationship with such section 12 as shown in FIG. 4. To put it still another way, the open loop gain, $A(j\omega)$, of the system for low frequencies is given in Eq. (13). However, for high frequencies, (i.e. beyond the bandwidth of the differential amplifier 30) such open loop gain is $$A(j\omega) = -(j\omega C)G_2(j\omega)G_3(j\omega) \quad (14)$$

such that the overall open loop gain, considering all frequencies, satisfies the Nyquist stability criterion. By providing the differential amplifier section 12 with a current source output and connecting the capacitor 38 between input terminal 20 and output 36, the response of the amplifier section in enabling the collector current $I_{c1}$ in transistor $Q_1$ to reach a steady state level proportional to the voltage applied to terminal 20 is extremely rapid. Since normally input terminal 20 is coupled to an input resistor, here resistor $R_1$, the current flow in the collector of transistor $Q_{112}'$ (and hence the collector current $I_{c1}$ in transistor $Q_1$) will rapidly become proportional to $I_1$.

Figure 3:
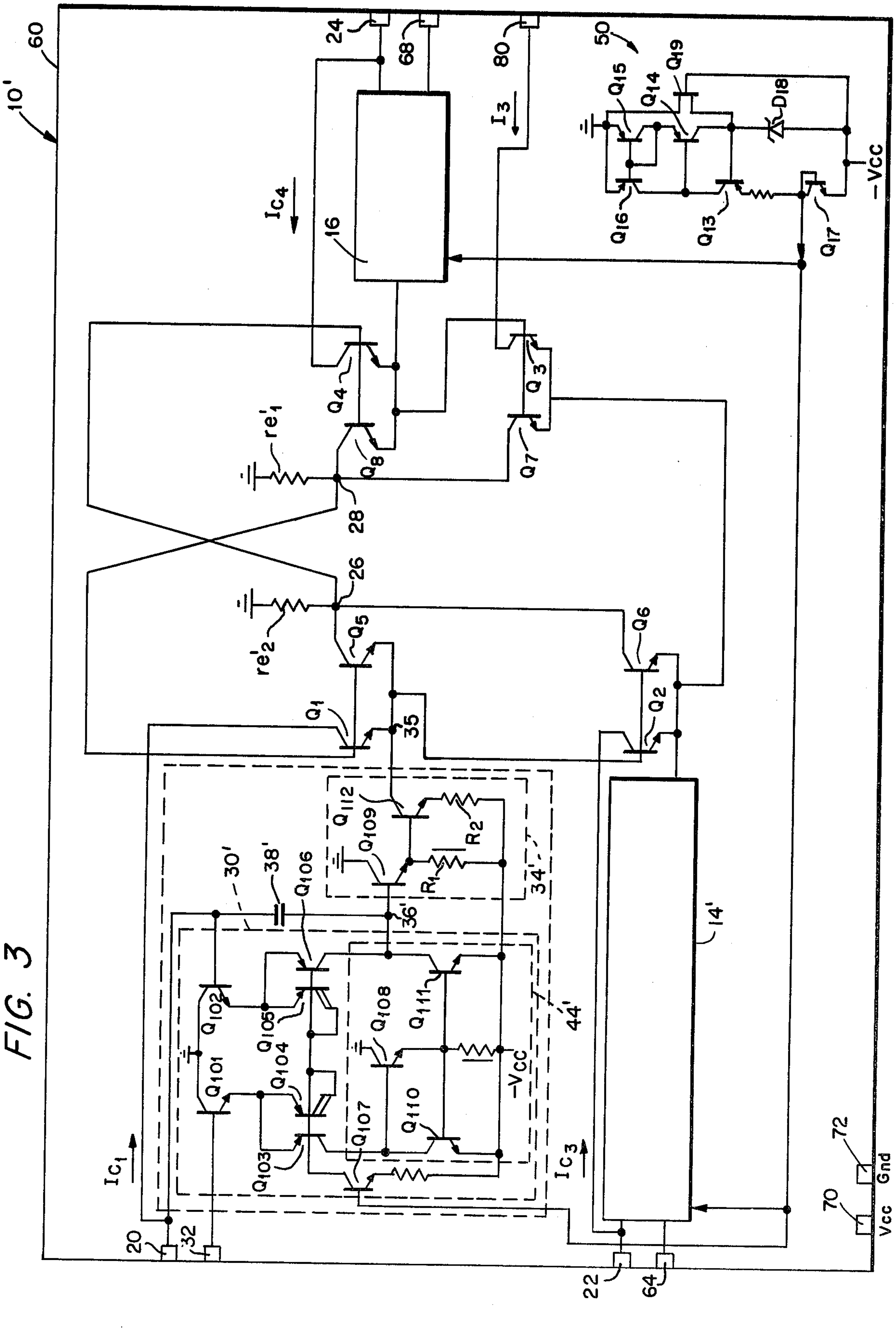
FIG. 3 is a schematic diagram of the multiplier/divider circuit shown in FIG. 1.

Referring now to FIG. 3, an analog multiplier/divider circuit 10' is shown. Such circuit is similar to the circuit 10 described in connection with FIG. 1, common elements having the same designation and equivalent elements having a "primed" (') superscript designation. Thus, the circuit shown in FIG. 3 has differential amplifying sections 12', 14', 16', as shown. An exemplary one of the differential amplifier sections 12', 14', 16', here section 12', is shown in detail to include: a differential amplifier 30' coupled to input terminals 20, 32; a current mirror circuit 44' fed by the differential amplifier 30' to produce a voltage at output 36' which is proportional to the difference in potential of signals fed to terminals 20, 32; a capacitor 38', here in the order of 25PF, connected between the output 36' and the input terminal 20, as shown; and a current source 34' coupled to output 36', as shown.

Transistors $Q_{101}$, $Q_{102}$, $Q_{103}$, $Q_{104}$, $Q_{105}$, $Q_{106}$ and $Q_{107}$ are arranged to function as the transistors $Q_A$, $Q_B$ and the current source 42 as shown in FIG. 2. Transistors $Q_{101}$, $Q_{102}$ have their collector electrodes connected to ground. The base electrode of transistor $Q_{101}$ is connected to input terminal 32, and the base electrode of transistor $Q_{102}$ is connected to input terminal 20 and the capacitor 38', as shown. Transistors $Q_{103}$, $Q_{104}$, $Q_{105}$, $Q_{106}$ have base electrodes connected together and to the collector electrode of transistor $Q_{107}$, as shown. The emitter electrodes of transistors $Q_{103}$, $Q_{104}$ are connected together and to the emitter electrode of transistor $Q_{101}$. The emitter electrodes of transistors $Q_{105}$, $Q_{106}$ are connected together and to the emitter electrodes of transistor $Q_{102}$. The collector electrodes of transistors $Q_{104}$ and $Q_{105}$ are connected to the base electrodes of such transistors, as shown. The base electrode of transistor $Q_{107}$ is connected to a reference voltage source 50, and the emitter electrode of such transistor $Q_{107}$ is connected to the $-V_{cc}$ supply through a resistor, here 3320 ohms, as shown. The reference voltage source 50 produces a reference voltage, here $(-V_{cc}+0.7)$ volts, at the base electrode of transistor $Q_{107}$. The collector electrodes of transistors $Q_{103}$, $Q_{106}$ are fed to current mirror circuit 44', as shown. Current mirror circuit 44' produces a voltage at output 36' which is proportional to the difference in voltage at the input terminals 20, 32. Such current mirror circuit includes a transistor $Q_{110}$ having: its emitter electrode connected to $-V_{cc}$; its collector electrode connected to the collector electrode of transistor $Q_{103}$ and to the base electrode of transistor $Q_{108}$; and its base electrode connected to the emitter electrode of transistor $Q_{108}$, the base electrode of transistor $Q_{111}$ and to $-V_{cc}$ through a resistor, here 20K ohms, as shown. Transistor $Q_{111}$ has its collector electrode connected to the collector electrode of transistor $Q_{106}$ and to the output 36' and its emitter electrode connected to $-V_{cc}$, as shown.

Current source 34' is coupled to the output 36', as shown, and includes a pair of transistors $Q_{109}$, $Q_{112}$, as shown. Transistor $Q_{109}$ has its emitter grounded, its base electrode connected to output 36' and its emitter electrode connected to $-V_{cc}$ through a resistor, $R_1$, here 20K ohms, and the base electrode of transistor $Q_{112}$.

The emitter electrode of transistor $Q_{112}$ is connected to $-V_{cc}$ through a resistor $R_2$, here 511 ohms. The collector electrode of transistor $Q_{112}$ is connected to output terminal 35 and the emitter electrode of transistors $Q_1$, $Q_5$, as shown. In operation, the amount of current flow through current source 34' is related to the voltage at output 36' and, hence, to the differential voltage between terminals 20, 32. Further, the current flow through such current source 34' is related to the current flow through the emitter electrode of transistor $Q_1$. Still further, the amount of current flow in the base electrode of transistor $Q_{102}$ is negligible compared to the current flow in the emitter electrode of transistor $Q_1$. Therefore, differential amplifier section 12', with the capacitor 38' connected between the input terminal 20 and output 36', enables the collector current of transistor $Q_1$ to rapidly achieve a steady state level related to the amount of current fed to terminal 20, i.e., the current $I_1$, as described in connection with FIGS. 1, 2 and 4.

Reference voltage source 50 here includes an output transistor $Q_{17}$ arranged as a diode to provide a voltage $(-V_{cc}+0.7)$ volts at its collector electrode. In particular, the emitter of transistor $Q_{17}$ is connected to $-V_{cc}$ and the base of such transistor is connected to its collector, as shown. The $-V_{cc}$ supply is connected to the base electrode of transistor $Q_{13}$, the collector electrode of transistor $Q_{14}$ and the source electrode of FET $Q_{19}$, through a Zener diode $D_{18}$, as shown. The collector electrode of transistor $Q_{13}$ is connected to the base electrode of transistor $Q_{14}$ and to the collector electrode of transistor $Q_{16}$, as shown. The emitter electrode of transistor $Q_{14}$ is connected to the base electrodes of transistors $Q_{16}$, $Q_{15}$, as shown. The emitter electrodes of transistors $Q_{16}$, $Q_{15}$ and the drain electrodes of FET $Q_{19}$ are connected to ground, as shown.

The analog multiplier/divider circuit 10' shown in FIG. 3 is formed on a semiconductor substrate 60 using conventional processing techniques. The substrate 60 has also formed thereon the input terminals 20, 32 for differential amplifier section 12'; input terminals 22, 64 for differential amplifier section 14'; input terminals 24, 68 for differential amplifier section 16'; a terminal 70 to enable connection to $-V_{cc}$ of a suitable voltage supply (not shown); and a terminal 72 to enable a connection to ground of such supply. (It is noted that terminal 68 may be removed by electrically connecting such point to ground.) An output terminal 80 is also formed on such substrate 60, such terminal 80 being connected to the collector electrode of transistor $Q_3$, as shown.

Referring also to FIG. 5, an output network 82 is shown connected to the collector electrode of transistor $Q_3$ via the output terminal 80 formed on the substrate 60. Such output network 82 includes an operational amplifier 84 having a feedback resistor $R_0$. The input to such amplifier 84 is connected to both the terminal 80 and the output of such operational amplifier. Therefore, such amplifier 84 produces a voltage $e_0$ proportional to the collector current $I_3$ of transistor $Q_3$. It is noted that the output network 82 is not here formed on the substrate 60 thereby enabling the circuit 10' formed on such substrate to be used in a wide variety of applications, such as: variable gain amplifier; square root circuit, etc..

Having described a preferred embodiment of this invention it is now evident that other embodiments incorporating these concepts may be used. It is felt, therefore, that this invention should not be restricted to the disclosed embodiment, but rather should be limited only by the spirit and scope of the appended claims.

What is claimed is:

1. An electronic circuit, comprising:

(a) an amplifier having an inut adapted for coupling to a signal source;

(b) an inverting current source serially coupled to the output of the amplifier;

(c) a feedback transistor having a collector electrode and an emitter electrode connected in series between the output of the inverting current source and the input of the amplifier, substantially all current passing through the emitter and collector electrodes of the feedback transistor also passing through the inverting current source;

(d) a lead network means, including the amplifier and a capacitor connected in parallel with the amplifier, such lead network means being connected in series between both the inverting current source and the emitter and collector electrodes of the transistor to provide a series compensation network for stabilizing the electronic circuit.

2. The circuit recited in claim 1 wherein the amplifier is a differential amplifier having a pair of transistors, one of such transistors having a base electrode adapted for coupling to a reference potential and the other transistor having a base electrode connected to the input of such amplifier.

3. The circuit recited in claim 2 wherein the differential amplifier includes a current mirror circuit adapted to produce a voltage at the output of such differential amplifier related to the differential current flow through the pair of transistors of the differential amplifier.

4. The circuit recited in claim 3 wherein the current source includes a pair of transistors, one of such transistors being arranged as an emitter follower fed by the current mirror and the second one of the pair of transistors is fed by the emitter follower transistor, the current flow through such second one of the transistors being related to the voltage at the output of the differential amplifier, the collector electrode of such second transistor providing the output for such electronic circuitry.

5. An electronic circuit comprising:

(a) means, including four transistors having serially coupled base emitter junctions, adapted to produce an output current in the collector electrode of one of such transistors proportional to the product of currents fed into collector electrodes of a second and third one of such transistors divided by current fed into the collector electrode of the fourth one of the transistors;

(b) three amplifier sections, each one thereof: (i) having the emitter and collector electrodes of a corresponding one of the second, third and fourth ones of the transistors coupled between the input and output of such one of the amplifier sections for producing a current in the collector electrode of such transistor related to current fed into the amplifier section, (ii) an amplifier having an input connected to the input of the amplifier section, (iii) an inverting current source serially coupled to the output of the amplifier, substantially all of the current produced in the collector electrode of such transistor passing through the inverting current source; and (iv) a lead network means, including the amplifier and a capacitor connected in parallel with the amplifier, such lead network means being connected in series with the inverting current source, for stabilizing the amplifier section with the transistor coupled between the input and output of the amplifier section.

6. An electronic circuit, comprising:

(a) a transistor having emitter and collector electrodes; and, (b) circuit means, connected in feedback relationship with the transistor, for producing a current through the electrodes of such transistor related to an input current fed to an input terminal of the current means, such circuit means including:

(a) a stability compensation network comprising:

(i) a capacitor; and (ii) an amplifier connected in parallel with the capacitor, such amplifier having an input connected to the input terminal of the circuit means; and (b) an inverting current source having an input serially coupled to an output of the compensating network and an output coupled to the transistor to enable substantially all of the current through the electrodes of the transistor to pass through the inverting current source.

7. The electronic circuit recited in claim 6 wherein the inverting current source includes a second transistor having a base electrode coupled to an output of the stability compensation network and a collector electrode connected directly to the emitter electrode of the first-mentioned transistor.

* * * * *